United States Patent [19]

Davis

[11] Patent Number: 5,343,162
[45] Date of Patent: Aug. 30, 1994

[54] RF VARIABLE GAIN TUNED OUTPUT AMPLIFIER WHICH MAINTAINS HIGH Q IN SATURATION

[75] Inventor: Paul C. Davis, Muhlenberg Township, Berks County, Pa.

[73] Assignee: AT&T Bell Laboratories, Murray Hill, N.J.

[21] Appl. No.: 43,511

[22] Filed: Apr. 6, 1993

[51] Int. Cl.⁵ .............................................. H03F 3/45
[52] U.S. Cl. ...................................... 330/252; 330/254
[58] Field of Search ............... 330/252, 254, 302, 306; 307/493, 494

[56] References Cited

U.S. PATENT DOCUMENTS

| | | | |
|---|---|---|---|
| 3,609,556 | 9/1971 | Benson et al. | 330/254 X |
| 3,838,210 | 9/1974 | Peil | 330/254 X |
| 4,528,516 | 7/1985 | Hill | 330/254 |
| 4,992,753 | 2/1991 | Jenson et al. | 330/129 |

OTHER PUBLICATIONS

The ARRL Handbook for the Radio Amateur, Sixty-Sixth Edition, 1989, Chapter 4, pp. 4-40.

Primary Examiner—Steven Mottola
Attorney, Agent, or Firm—Scott W. McLellan

[57] ABSTRACT

An amplifier with variable gain which maintains high Q when saturated. A resonant circuit is connected between collector outputs of a differential pair of transistors and RF chokes couple DC supply current to the transistors. The chokes have a high impedance at the desired frequency. The emitters of the differential pair of transistors couple together to form a common output which is connected to a current source. The amount of current from the current source substantially controls the gain of the amplifier. Because the resonant circuit is not shunted with a low impedance even when one of the transistors saturates, the Q of the resonant circuit is maintained.

6 Claims, 1 Drawing Sheet

RF VARIABLE GAIN TUNED OUTPUT AMPLIFIER WHICH MAINTAINS HIGH Q IN SATURATION

BACKGROUND OF THE INVENTION

1. Field of the Invention

This invention relates to amplifiers generally and, more particularly, to differential amplifiers and to differential power amplifiers.

2. Description of the Prior Art

Differential radio frequency (RF) power amplifiers traditionally operate as a class B amplifier. The output power of the amplifier is generally controlled by limiting the input signal to the amplifier. However, the output power from the power amplifier for a given input signal level may be unpredictable, requiring complex circuitry to regulate the output signal power. See U.S. Pat. No. 4,992,753 for one such approach. In portable and/or cellular applications, this may lead to more complex circuitry than desired and an attendant increase in power consumption.

Another problem with conventional differential, tuned output, amplifiers (power or non-power) is the effect of amplifier saturation. When the amplifier saturates, the resonant circuit in the output of the amplifier becomes shunted by a low impedance, drastically lowering the Q of the tuned circuit. This may reduce the efficiency of the amplifier and increase the harmonics generated by the amplifier.

For example, a conventional differential tuned output amplifier (e.g., an IF amplifier or class B power amplifier) has disposed across the differential output thereof a center-tapped inductor as part of the tuned circuit. The power supply for the amplifier is connected to the center tap. When the amplifier saturates, the inductor is shunted by a low impedance, as discussed above. Further, the inductance of the inductor may be different on either side of the center tap, exacerbating the problems with amplifier saturation.

Thus, it is desirable to provide an amplifier design which can maintain the Q of the tuned circuits in the output thereof when saturated. Further, it is desirable to provide an amplifier design which has a well controlled and predictable gain.

SUMMARY OF THE INVENTION

These and other aspects of the invention may be achieved generally in an amplifier having an input and an output, the amplifier having: differential pair of transistors having a common output and two outputs and two inputs, the inputs coupling to the input of the amplifier and the two outputs coupling to the output of the amplifier; a current source coupling to the common output of the transistors; a resonant circuit connected between the two outputs of the transistors; high impedance means connected between the two outputs of the transistors and a power supply terminal to provide a path for current to the transistors. Even when one of the transistors saturates, the resonant circuit is not shunted with a low impedance, thus maintaining the Q of the circuit. The amount of current supplied by the current source substantially controls the gain of the amplifier.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
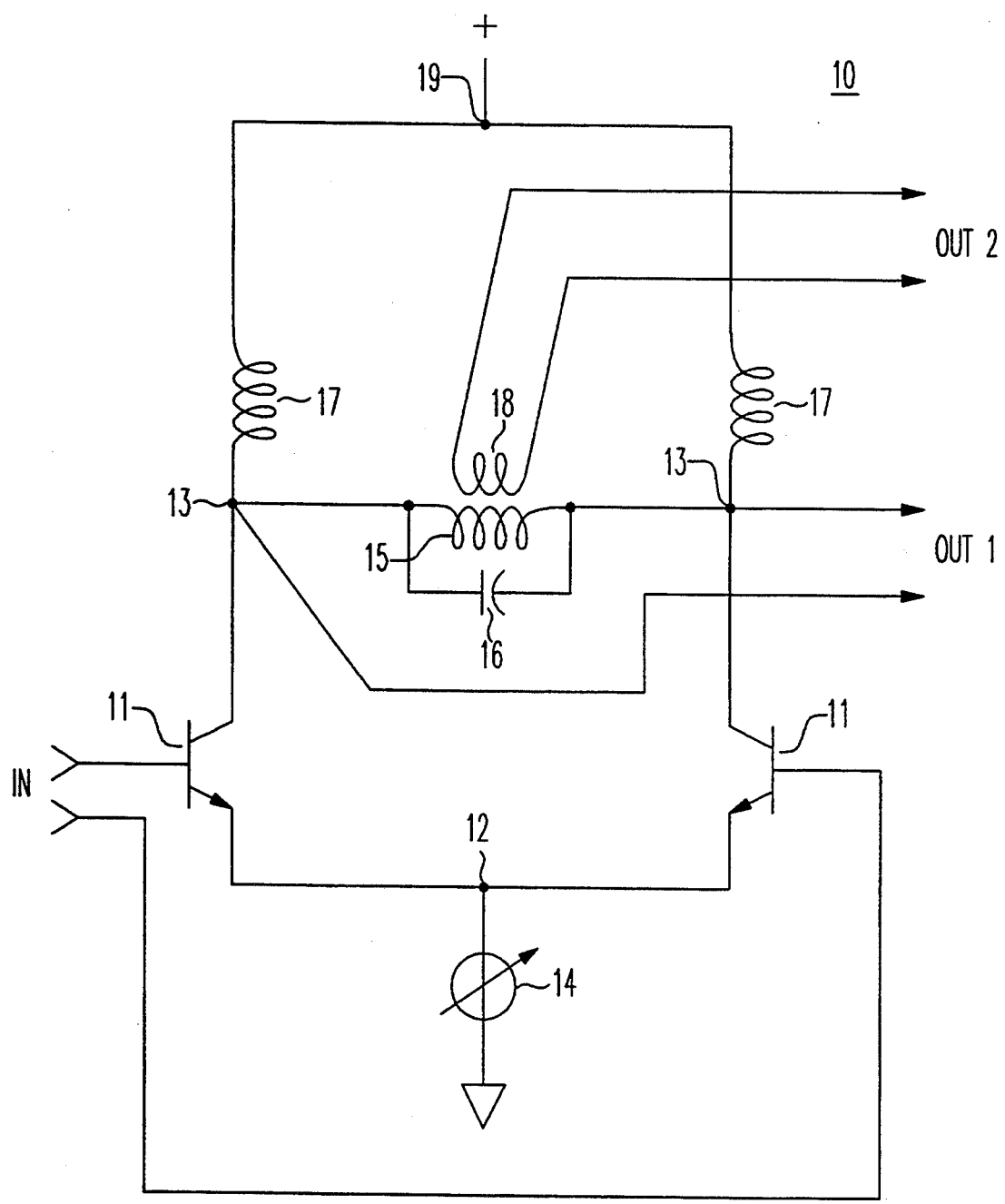
FIG. 1 is a simplified schematic diagram of an exemplary power amplifier according to one aspect of the invention.

Referring to FIG. 1, one exemplary embodiment of the invention is shown. In summary, an amplifier 10 has an input (IN) and an output (OUT1, OUT2). A differential pair of transistors 11 has a common output 12 and two outputs 13 and two inputs, the inputs couple to the input of the amplifier and the two outputs couple to the output of the amplifier. A variable current source 14 couples to the common output 12 of the transistors 11 to vary the gain of the amplifier 10, as will be discussed below. A resonant tank circuit is formed by a paralleled-coupled inductor 15 and a capacitor 16 connected between the two outputs 13 of the transistors 11. High impedance inductors 17 couple supply current to the transistors 11.

In more detail, the amplifier 10 has two bipolar transistors 11 arranged as a differential amplifier. The emitters thereof couple together to form a common output node 12. The bases of the transistors 11 couple to the input of the amplifier 10, any necessary bias circuitry not being shown for purposes of simplicity. The collectors of the transistors 11 couple to the two output nodes 13. A resonant circuit of an inductor 15 and parallel-connected capacitor 16 connects between the output nodes 13. The combination of inductor 15 and capacitor 16 (plus any additional stray inductance and capacitance in the output portion of the amplifier 10) preferably resonate at the desired operating frequency of the amplifier. Inductors 17 supply current to the transistors 11 from a power supply bus 19. Preferably, the impedance of the inductors 17 are much greater than the load impedance (not shown) on the output nodes 13 while having a low resistance at DC.

The output nodes 13 additionally couple to the output of the amplifier 10. Two alternative outputs are provided, direct coupling to the nodes 13 (differential output OUT1) or inductive coupling via an additional winding 18 on inductor 15 (OUT2). The winding 18 allows for a differential or a single-ended output from the amplifier 10. The outputs may be coupled to an additional gain stage or an antenna, for example.

The current source 14 is a conventional current source which may, as shown here, be a variable current source. The amount of current supplied by the source 14 substantially controls the gain of the amplifier 10.

EXEMPLARY AMPLIFIER

The amplifier 10 has been fabricated as an output power amplifier stage in a 50 MHz personal, portable, communication system. When the amplifier 10 is driven with an input signal sufficient to fully switch the transistors 11, the output power of the amplifier 10 varies between 0.8 and 14.5 mW as the current source 14 is adjusted between 4 and 8 mA. The impedance of the RF choke inductors 17 is 30 KΩ at 50 MHz, with a load presented to the outputs 13 of 800Ω.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. An amplifier for amplifying to an output RF signals applied to an input, CHARACTERIZED BY:
   a differential pair of transistors having a common output and two outputs and two inputs, the inputs coupling to the input of the amplifier and the two outputs coupling to the output of the amplifier;
   a current source coupling to the common output of the transistors;
   a resonant circuit connected between the two outputs of the transistors; and
   high impedance means having a high impedance to RF signals connected between the two outputs of the transistors and a power supply terminal to provide a path for current to the transistors; wherein RF signals on the two outputs of the differential pair of transistors are not bypassed to ground.

2. The amplifier as recited in claim 1, wherein the current source is a variable source, the amount of current from the current source substantially controls the gain of the amplifier.

3. The amplifier as recited in claim 2, wherein the high impedance means are RF chokes.

4. The amplifier as recited in claim 3, wherein the resonant circuit is a parallel resonant tank circuit.

5. The amplifier as recited in claim 4, wherein the transistors are bipolar transistors, the emitters thereof being coupled together to form the common output and the collectors thereof forming the two outputs.

6. The amplifier as recited in claim 5, further characterized by the resonant tank circuit having an additional winding thereon serving as the output of the amplifier.

* * * * *